(12) United States Patent
Kim et al.

(10) Patent No.: US 7,936,120 B2
(45) Date of Patent: May 3, 2011

(54) ORGANIC LIGHT EMITTING DEVICE AND METHOD OF MANUFACTURING THE SAME

(75) Inventors: Sang-Yeol Kim, Gwacheon-si (KR); Sang-Hoon Park, Seongnam-si (KR); Tae-Woo Lee, Seoul (KR); Byoung-Ki Choi, Hwaseong-si (KR); Jong-Jin Park, Guri-si (KR); Mu-Gyeom Kim, Hwaseong-si (KR); In-Nam Kang, Ansan-si (KR)

(73) Assignee: Samsung Mobile Display Co., Ltd., Giheung-Gu, Yongin, Gyunggi-Do (KR)

(*) Notice: Subject to any disclaimer, the term of this patent is extended or adjusted under 35 U.S.C. 154(b) by 1044 days.

(21) Appl. No.: 11/347,660

(22) Filed: Feb. 6, 2006

(65) Prior Publication Data

US 2006/0175963 A1    Aug. 10, 2006

(30) Foreign Application Priority Data

Feb. 5, 2005   (KR) .................. 10-2005-0010986

(51) Int. Cl.
*H01J 1/62*    (2006.01)
*H01J 63/04*   (2006.01)

(52) U.S. Cl. ........ 313/504; 313/498; 313/503; 313/506; 313/512

(58) Field of Classification Search ........... 313/498–512
See application file for complete search history.

(56) References Cited

U.S. PATENT DOCUMENTS

| | | | |
|---|---|---|---|
| 5,518,824 A | 5/1996 | Funhoff et al. | |
| 6,344,285 B1 | 2/2002 | Kwon | |
| 6,452,330 B1* | 9/2002 | Steffensmeier | 313/505 |
| 6,573,650 B2 | 6/2003 | Aoki et al. | |
| 7,351,999 B2* | 4/2008 | Li | 257/40 |
| 2003/0042850 A1* | 3/2003 | Bertram et al. | 313/504 |
| 2004/0185300 A1* | 9/2004 | Hatwar et al. | 428/690 |
| 2005/0048311 A1* | 3/2005 | Hatwar et al. | 428/690 |
| 2006/0115673 A1* | 6/2006 | Li | 428/690 |
| 2006/0186796 A1* | 8/2006 | Yabe et al. | 313/504 |

(Continued)

FOREIGN PATENT DOCUMENTS

CN    1103230 A    5/1995

(Continued)

OTHER PUBLICATIONS

Office action from Japanese Patent Office issued in Applicant's corresponding Japanese Patent Application No. 2006-021411 dated Mar. 2, 2010 and Request for Entry of the Accompanying Office Action for Japanese Office action attached herewith.

(Continued)

*Primary Examiner* — Joseph L Williams
*Assistant Examiner* — Kevin Quarterman
(74) *Attorney, Agent, or Firm* — Robert E. Bushnell, Esq.

(57) ABSTRACT

An organic light emitting device (OLED) and a method of manufacturing the OLED. The OLED includes an anode, a cathode, a hole transport layer arranged between the anode and the cathode, a self-buffer layer arranged between the hole transport layer and the cathode, the self-buffer layer being adapted to protect the hole transport layer, the self-buffer layer being made of a first material and a light emitting layer arranged between the self-buffer layer and the cathode, the light emitting layer also being made of the first material.

17 Claims, 8 Drawing Sheets

U.S. PATENT DOCUMENTS

2006/0202614 A1* 9/2006 Li .................................. 313/506

FOREIGN PATENT DOCUMENTS

| CN | 1828968 B | 10/2010 |
| JP | 2002158089 | 5/2002 |
| JP | 2002203675 | 7/2002 |
| JP | 2005129450 | 5/2005 |
| WO | 03069959 | 8/2003 |

OTHER PUBLICATIONS

Office action from the Chinese Patent Office issued in Applicant's corresponding Chinese Patent Application No. 200610006092X dated Oct. 17, 2008.

* cited by examiner

ORGANIC LIGHT EMITTING DEVICE AND METHOD OF MANUFACTURING THE SAME

CLAIM OF PRIORITY

This application makes reference to, incorporates the same herein, and claims all benefits accruing under 35 U.S.C. §119 from an application for ORGANIC ELECTROLUMINESCENT DEVICE AND METHOD OF MANUFACTURING THE SAME earlier filed in the Korean Intellectual Property Office on 5 Feb. 2005 and there duly assigned Serial No. 10-2005-0010986.

BACKGROUND OF THE INVENTION

1. Field of the Invention

The present invention relates to an organic light emitting device (OLED) and a method of manufacturing the same, and more particularly, to a polymer OLED that uses a self-buffer layer to improve color purity and improve lifespan.

2. Description of the Related Art

OLEDs are self-light-emitting type light emitting display devices that emit light using an organic compound. OLEDs are thin and have higher response speed, lower power consumption, and lower manufacturing costs than TFT-LCDs since they have a simpler structure and a simpler manufacturing process.

OLEDs are devices that transform electrical energy into optical energy in an organic material. That is, the OLEDs are devices that emit light by generating excitons by recombining holes and electrons respectively injected from an anode and a cathode into the organic material.

A basic structure of a conventional OLED includes an anode, an emission material layer, a cathode that are sequentially stacked. The performance of the OLED is largely affected by the variation of a multi-layer thin film structure, and the light emitting efficiency and lifespan of the OLED can be improved by adding various functional layers to the basic structure.

Conventional OLEDs can be manufactured by organic molecular beam deposition (OMBD), i.e., a dry process, but polymer OLEDs are mainly manufactured by a spin coating method or an ink jet method, i.e., wet processes, to form multi-layer thin films.

The conventional OLED includes a transparent electrode, a hole injection layer, a hole transport layer, a light emitting layer, and an upper electrode sequentially stacked on a transparent substrate. Multi-layer thin films are included in the conventional OLED and the lifespan of the device can be improved by complementary functions of each of the multi-layer thin films.

Meanwhile, a spin coating method is generally used for forming the light emitting layer on the hole transport layer when the conventional OLED is manufactured. However, a solution used for the spin coating method can dissolve the hole injection layer and a hole transport layer, which are lower layers, since the solution contains a solvent such as chlorobenzene, toluene, xylene, cyclohexanone, chloroform, or THF, which has high solubility with a main component of the light emitting layer.

That is, an already stacked layer can be dissolved since a solution used for a wet process for forming a multi-layer thin film generally contains a solvent having high solubility. Defects generated at this time can reduce the lifespan and color purity of a device. However, if a solvent having low solubility is used, each layer can not be formed to a desired thickness. What is therefore needed is an improved OLED and a method of making the same where the underlying layers do not have many defects while allowing for subsequent layers to be formed at an adequate thickness.

SUMMARY OF THE INVENTION

It is therefore an object of the present invention to provide an improved design for an OLED.

It is further an object of the present invention to provide a method of making the improved OLED.

It is also an object of the present invention to provide an OLED where the defect count of the layers is kept low while the layers are formed to substantial thicknesses.

It is still an object of the present invention to provide an OLED with improved color purity and improved lifespan.

It is yet an object of the present invention to provide a method of manufacturing the improved OLED.

These and other objects can be achieved by an OLED that includes an anode, a cathode, a hole transport layer arranged between the anode and the cathode, a self-buffer layer arranged between the hole transport layer and the cathode, the self-buffer layer being adapted to protect the hole transport layer, the self-buffer layer including a first material, and a light emitting layer arranged between the self-buffer layer and the cathode, the light emitting layer also including the first material. The first material can be a conductive polymer.

According to another aspect of the present invention, there is provided an OLED that includes an anode, a cathode, a hole transport layer arranged between the anode and the cathode, a light emitting layer arranged between the hole transport layer and the cathode, a self-buffer layer arranged between the light emitting layer and the cathode, the self-buffer layer being adapted to protect the light emitting layer, the self-buffer layer including a first material, and an electron transport layer arranged between the self-buffer layer and the cathode, the electron transport layer including the first material. The first material can be a conductive polymer.

According to still another aspect of the present invention, there is provided an OLED that includes an anode, a cathode, a hole transport layer arranged between the anode and the cathode, a first self-buffer layer arranged between the hole transport layer and the cathode, the self-buffer layer being adapted to protect the hole transport layer, the first self-buffer layer being comprised of a first material, a light emitting layer arranged between the self-buffer layer and the cathode, the light emitting layer also being comprised of the first material, a second self-buffer layer arranged between the light emitting layer and the cathode, the second self-buffer layer being adapted to protect the light emitting layer, the self-buffer layer comprising a second material, and an electron transport layer arranged between the self-buffer layer and the cathode, the electron transport layer comprising the second material. The first and second material is a conductive polymer.

According to still another aspect of the present invention, there is provided a method of making an OLED, including forming an anode on a substrate, forming a hole transport layer on the anode, forming a self-buffer layer on the hole transport layer using a first solvent, forming a light emitting layer on the self-buffer layer using a second solvent and forming a cathode on the light emitting layer, wherein the first solvent has less solubility with the hole transport layer than the second solvent. The self-buffer layer and the light emitting layer each can include a conductive polymer of a same kind.

According to yet another aspect of the present invention, there is provided another method of making another OLED, including forming an anode on a substrate, forming a hole transport layer on the anode, forming a light emitting layer on the hole transport layer using a first solvent, forming a self-buffer layer on the light emitting layer using a second solvent, forming an electron transport layer on the self-buffer layer, and forming a cathode on the electron transport layer, wherein the first solvent has more solubility with the hole transport layer than the second solvent. The self-buffer layer and the electron transport layer can each be made out of a conductive polymer of a same kind.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
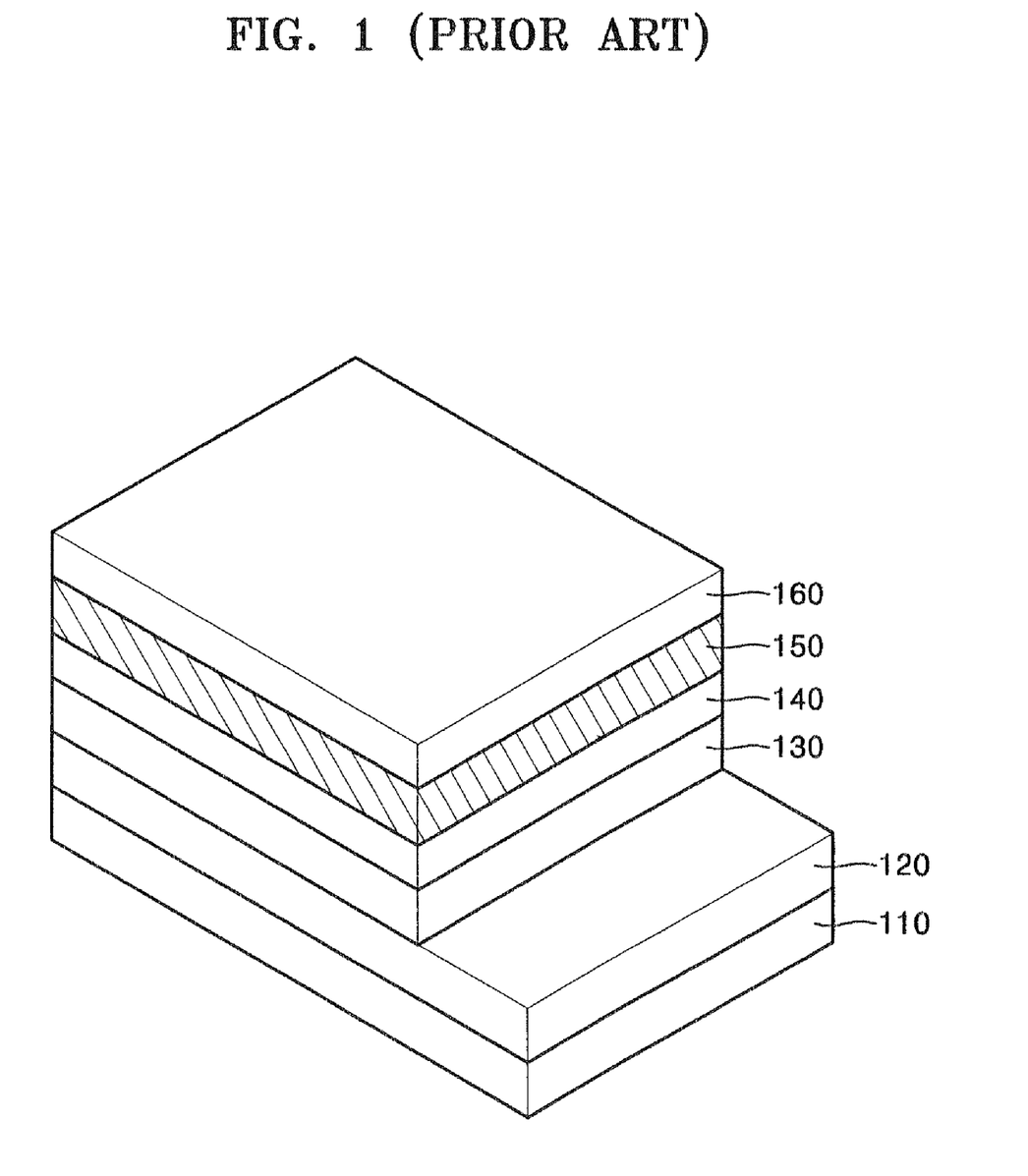
FIG. 1 is a perspective view illustrating an OLED.

Turning now to the figures, FIG. 1 is a perspective view illustrating an OLED. Referring to FIG. 1, the OLED includes a transparent electrode 120, a hole injection layer 130, a hole transport layer 140, a light emitting layer 150, and an upper electrode 160, which are sequentially stacked on a transparent substrate 110. Multi-layer thin films are included in the OLED and the lifespan of the device can be improved by complementary functions of each of the multi-layer thin films.

Meanwhile, a spin coating method is generally used for forming the light emitting layer 150 on the hole transport layer 140 when the OLED is manufactured. However, a solution used for the spin coating method can dissolve the hole injection layer 130 and a hole transport layer 140, which come in contact with the solution, since the solution contains a solvent such as chlorobenzene, toluene, xylene, cyclohexanone, chloroform, or THF, which have high solubility with a main component of the light emitting layer 150.

That is, an already formed layer can be dissolved in the formation of a subsequent layer since a solution used for a wet process for forming a subsequent layer generally contains a solvent having high solubility. Defects generated at this time can reduce the lifespan and color purity of the final device. However, if a solvent having low solubility is used, each layer can not be formed to a desired thickness.

Figure 2:
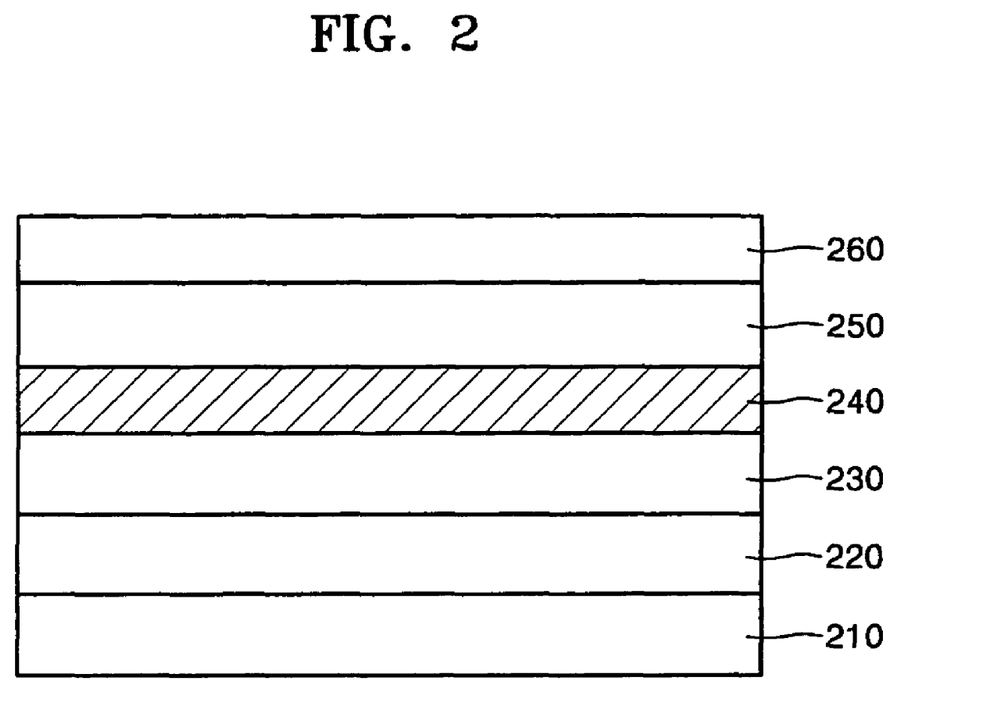
FIG. 2 is a cross-sectional view illustrating an OLED according to a first embodiment of the present invention.

Turning now to FIG. 2, FIG. 2 is a cross-sectional view illustrating an OLED according to a first embodiment of the present invention. Referring to FIG. 2, the OLED includes an anode 220, a hole transport layer 230, a self-buffer layer 240, a light emitting layer 250, and a cathode 260 sequentially stacked on a substrate 210.

The substrate 210 is preferably formed of a transparent material, such as glass, quartz, or an organic polymer compound. The anode 220 is preferably formed of a material having high transparency and a high work function, such as indium tin oxide (ITO) or indium zinc oxide (IZO).

The hole transport layer 230 includes one or more of a hole injection layer (HIL), a hole transport layer (HTL), and an electron blocking layer (EBL). The hole transport layer 230 can be formed of electron donor molecules having low ionization potential, such as diamine, triamine, or tetraamine based on triphenylamine, to facilitate the injection of holes from the anode 220.

The self-buffer layer 240 is dissolved into a solvent that does not damage much the hole transport layer 230. The self-buffer layer 240 can be formed of a conductive polymer that can protect the hole transport layer 230 from solvents, like a chlorobenzene group solvent, used later to form the light emitting layer 250. Here, the self-buffer layer 240 is formed of the same material as the light emitting layer 250.

The light emitting layer 250 is a layer that generates light by electrons injected from the cathode 260 and holes injected from the anode 220 upon combination within. Preferably, the light emitting layer 250 is formed of conductive polymer. The cathode 260 is preferably formed of a material having a low work function and a high electrical conductivity, such as a Mg—Ag alloy, so that electrons can be readily supplied to the light emitting layer 250 at a low driving voltage.

The thickness of the self-buffer layer 240 is preferably between 5 and 30 nm so that the self-buffer layer 240 can act as a protective thin film while allowing for the transmittance of light therethrough. The thickness of the light emitting layer 250 is preferably between 50 and 150 nm to allow for a miniaturized OLED. More preferably, the light emitting layer 250 is between 50 and 100 nm.

Figure 3:
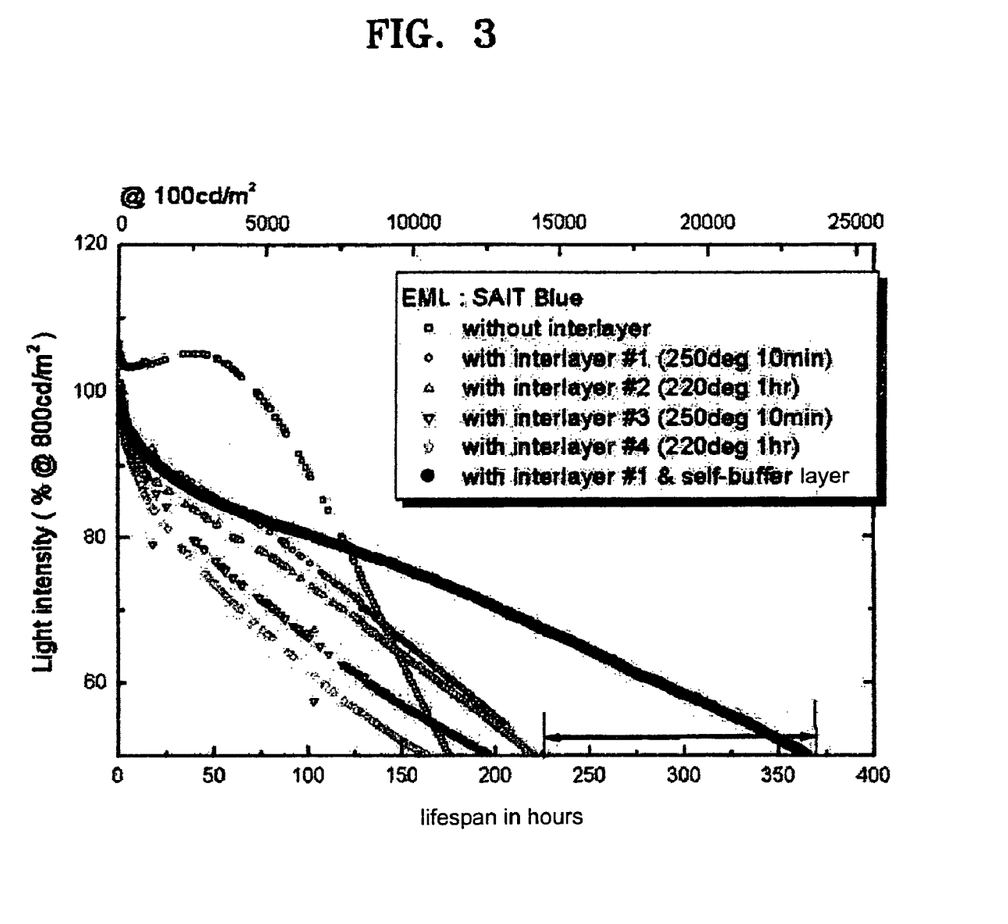
FIG. 3 is a graph comparing light emitting lifetimes of an OLED without a self-buffer layer and the OLED of FIG. 2 having a self-buffer layer.

Turning now to FIG. 3, FIG. 3 is a graph for comparing light emitting lifetimes of an OLED without a self-buffer layer and the OLED of FIG. 2 which includes the self-buffer layer 240. Referring to FIG. 3, the lifespan of an OLED without a self-buffer layer is no more than 250 hours even when the interlayer condition varies. However, the lifespan of an OLED having a self-buffer layer 240 and an interlayer formed together is greater than 350 hours.

Figure 4:
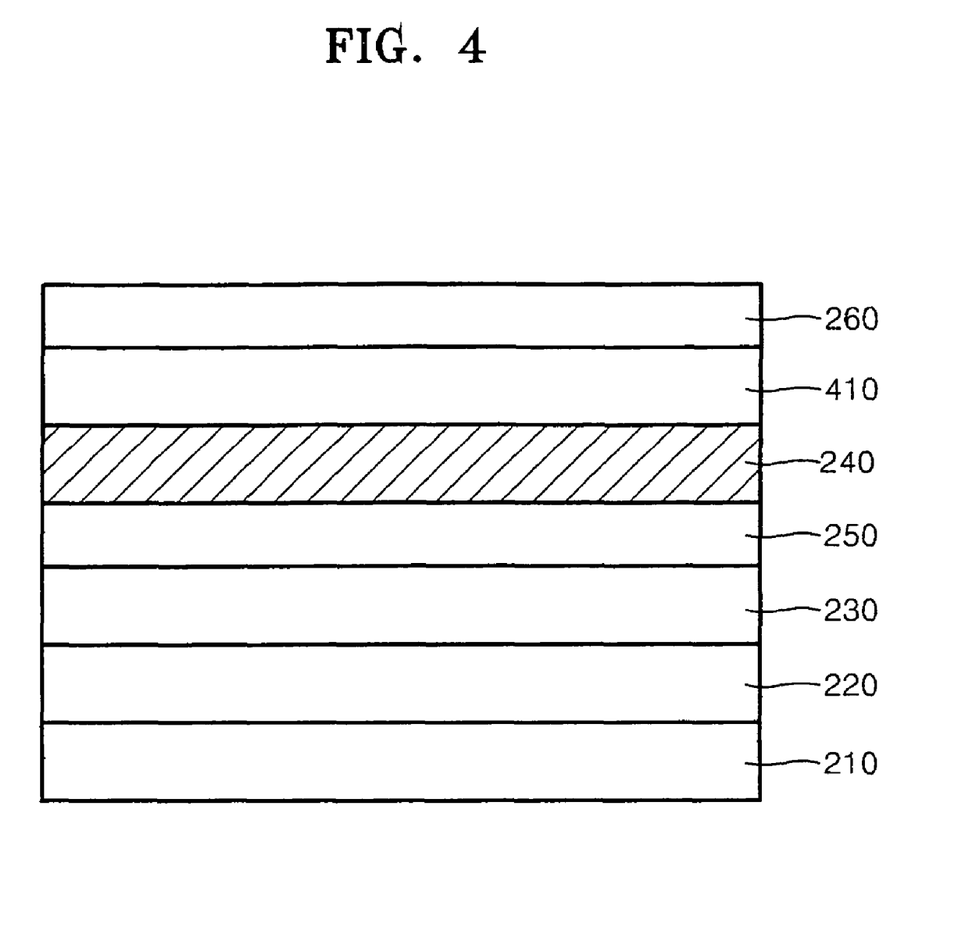
FIG. 4 is a cross-sectional view illustrating an OLED according to a second embodiment of the present invention.

Turning now to FIG. 4, FIG. 4 is a cross-sectional view illustrating an OLED according to a second embodiment of the present invention. The same reference numerals used in FIG. 2 are also used in FIG. 4 to refer to the same elements. As a result, their descriptions will not be repeated here since the elements are substantially the same.

Referring to FIG. 4, the OLED includes an anode 220, a hole transport layer 230, a light emitting layer 250, a self-buffer layer 240', an electron transport layer 410, and a cathode 260 sequentially stacked on a substrate 210. The electron transport layer 410 includes one or more of an electron transport layer (ETL), an electron injection layer (EIL), and a hole blocking layer (HBL). The self-buffer layer 240' is formed of the same material as that used to form the electron transport layer 410. The electron transport layer 410 is a layer that smoothly transports electrons supplied from the cathode 260 to the light emitting layer 250. The electron transport layer 410 serves to increase the possibility of recombination of holes and electrons in the light emitting layer 250 by preventing holes that did not recombine in the light emitting layer 250 from penetrating into the electron transport layer 410. The electron transport layer 410 can be formed of a material having electron affinity and adhesiveness with the electron injecting cathode 260, such as 1,2,4-phenylbiphenylyloxadiazole (PBD) or Alq$_3$.

Figure 5:
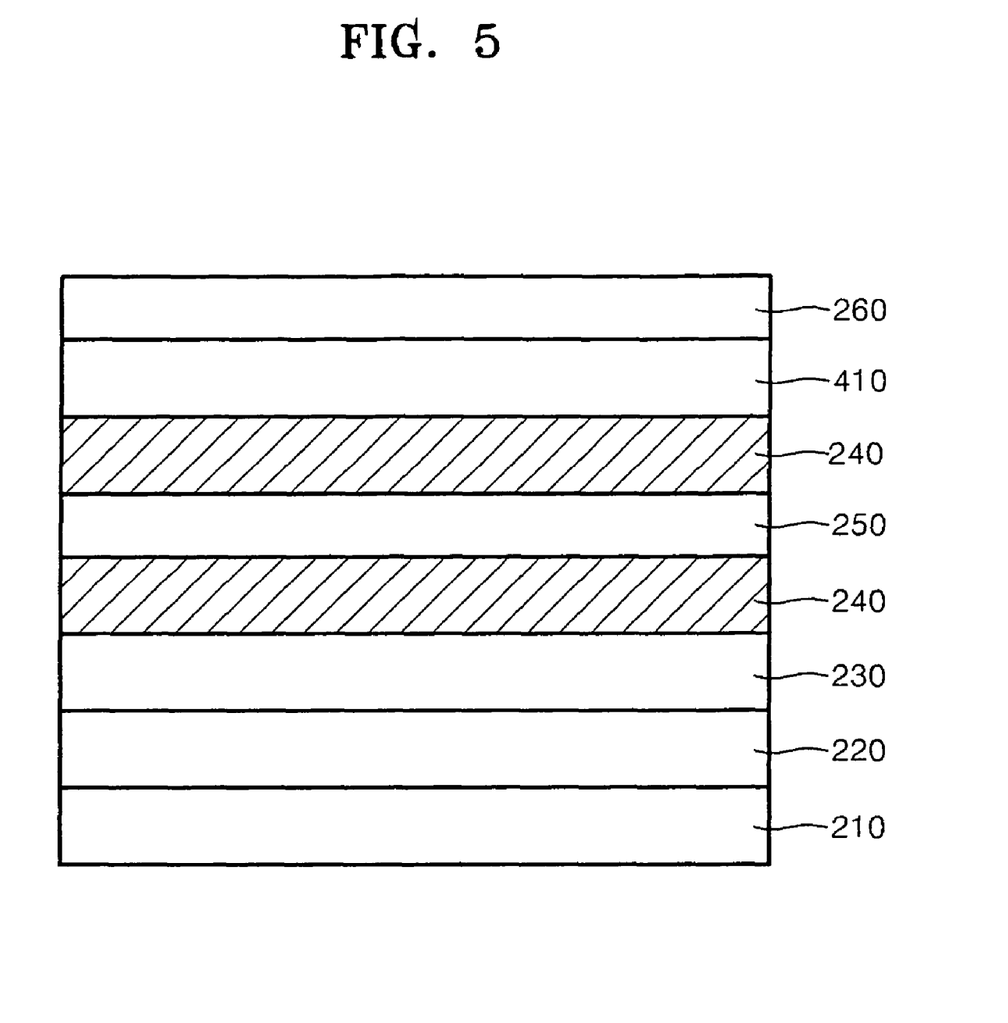
FIG. 5 is a cross-sectional view illustrating an OLED according to a third embodiment of the present invention.

Turning now to FIG. 5, FIG. 5 is a cross-sectional view illustrating an OLED according to a third embodiment of the present invention. Referring to FIG. 5, the OLED includes an anode 220, a hole transport layer 230, a first self-buffer layer 240, a light emitting layer 250, a second self-buffer layer 240', a electron transport layer 410 and a cathode 260 sequentially stacked on a substrate 210. The same reference numerals used in FIGS. 2 and 4 are also used in FIG. 5 to refer to the same elements. As a result, their descriptions will not be repeated here since the elements are substantially the same.

Figure 6:
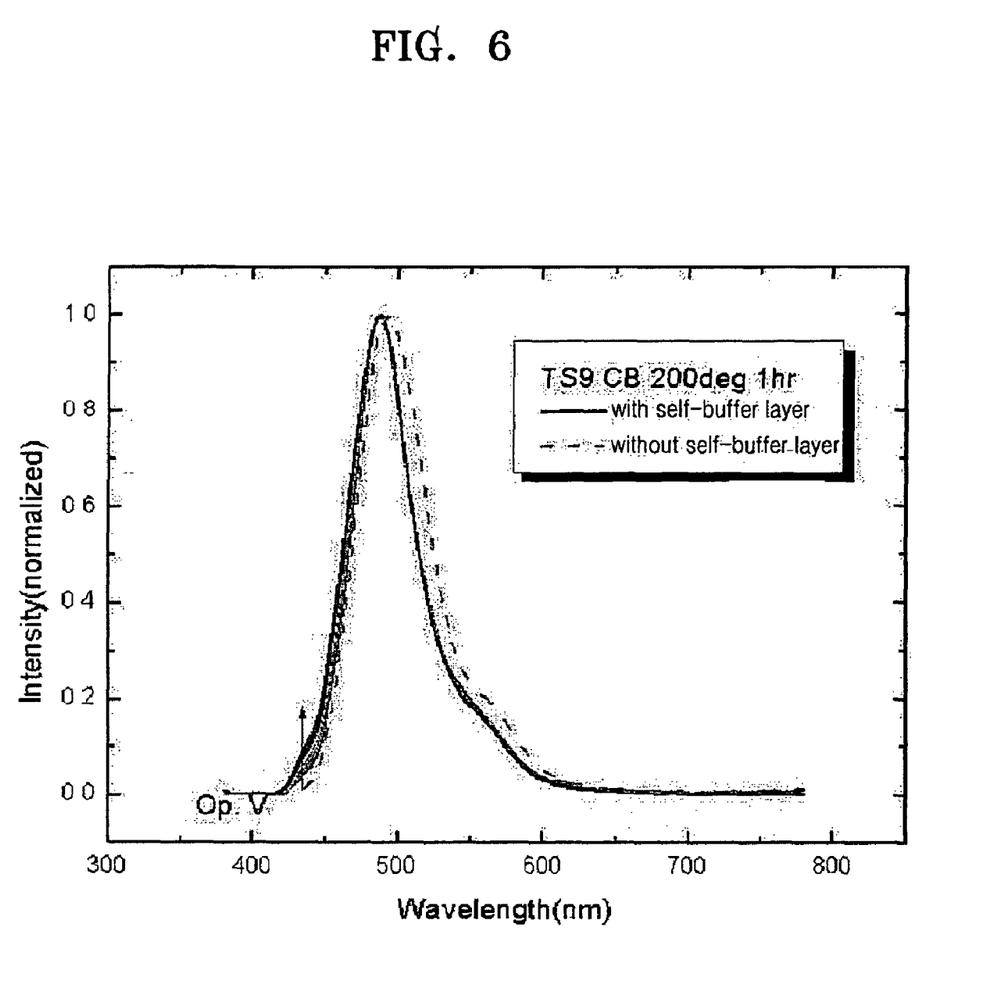
FIG. 6 is a graph comparing a wavelength region of an OLED without a self-buffer layer and the OLED of FIG. 4 having a self-buffer layer.

Turning now to FIG. 6, FIG. 6 is a graph for comparing light wavelengths of an OLED without a self-buffer layer to the OLED of FIG. 4 having the self-buffer layer 240'. Referring to FIG. 6, the color purity of an OLED of FIG. 4 is improved when compared to that of an OLED without a self-buffer layer. That is, when a self-buffer layer 240' is present, the color purity of light is respectively improved from (0.16, 0.39) to (0.15, 0.31).

Figure 7:
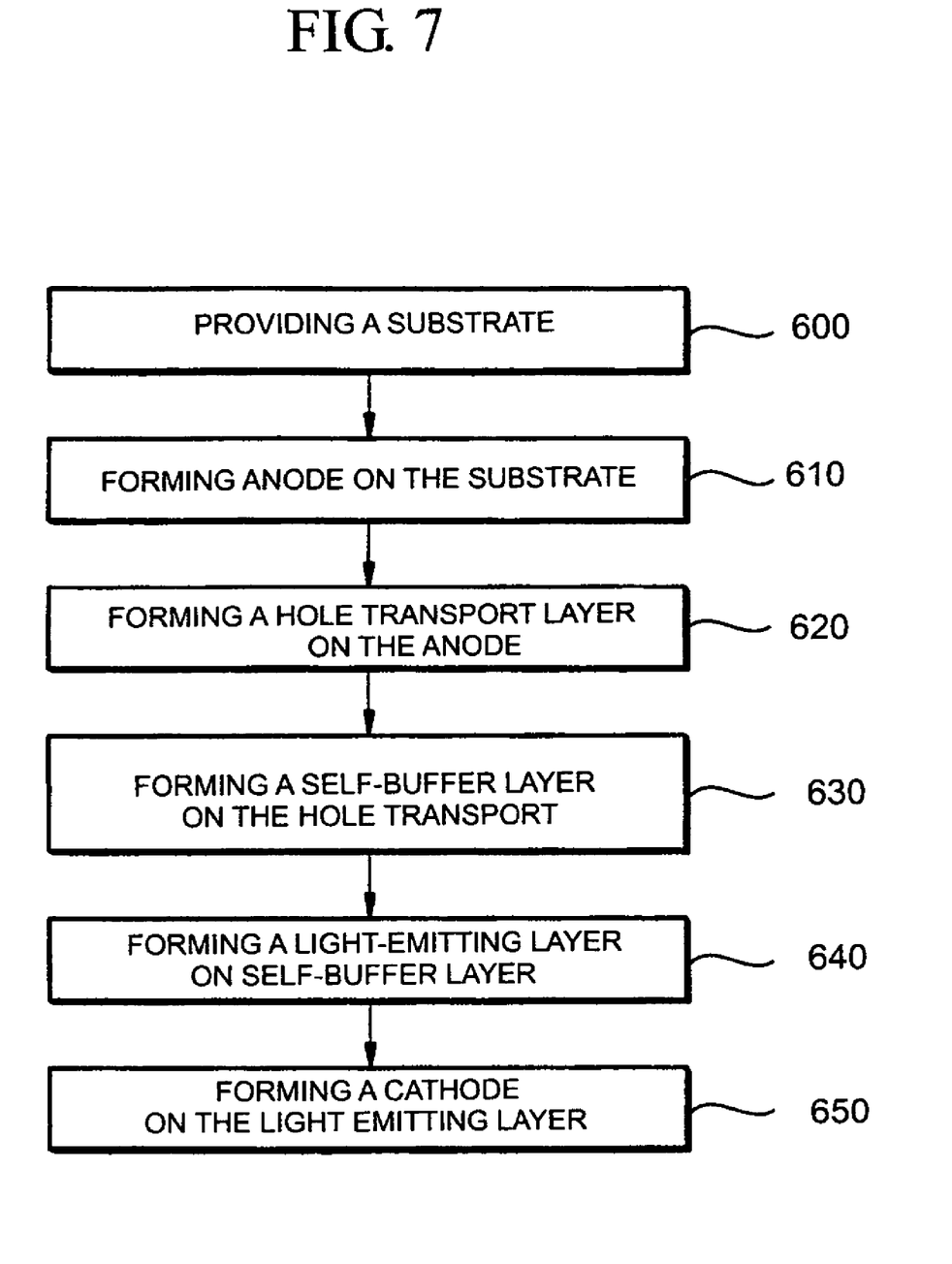
FIG. 7 is a flow chart of a method of manufacturing the OLED of FIG. 2.

Turning now to FIG. 7, FIG. 7 is a flow chart illustrating a method of manufacturing the OLED of FIG. 2 according to an embodiment of the present invention. Referring to FIG. 7, the method includes providing the substrate 210 (step 600), forming the anode 220 on the substrate 210 (step 610), forming the hole transport layer 230 on the anode 220 (step 620), forming the self-buffer layer 240 on the hole transport layer 230 to protect the hole transport layer 230 (step 630), forming the light emitting layer 250 on the self-buffer layer 240 using the same material for forming the self-buffer layer 240 (step 640), and forming the cathode 260 on the light emitting layer 250 (step 650). The self-buffer layer 240 is preferably made of a conductive polymer.

The OLED of FIG. 2 is manufactured by a wet process, such as a spin coating method. Especially, in the forming of the self-buffer layer 240 in step 630, a buffer layer solvent, such as a solvent of a xylene group or a toluene group, is used. Such a solvent produces fewer defects in the hole transport layer 230 and has less solubility than a solvent used for forming the light emitting layer 250. After coating a buffer layer solution that includes a buffer layer solvent and a conductive polymer solute on the hole transport layer 230, the resultant product is baked. This causes a self-buffer layer 240 to be formed on the hole transport layer 230. Next, when the light emitting layer 250 is formed on the self-buffer layer 240 in step 640, a solvent having high solubility, such as a solvent of a chlorobenzene group, is generally used. In step 640, the conductive polymer self-buffer layer 240 formed on the hole transport layer 230 serves to protect the hole transport layer 230 from being damaged by the chlorobenzene group solvent that is used to make the light emitting layer 250.

The thickness of the self-buffer layer 240 is preferably between 5 and 30 nm so that the self-buffer layer 240 can serve as a protective film while allowing for the transmittance of light. The thickness of the light emitting layer 250 is preferably between 50 and 150 nm to minimize the device size. Preferably, the light emitting layer 250 is between 50 and 100 nm thick.

Figure 8:
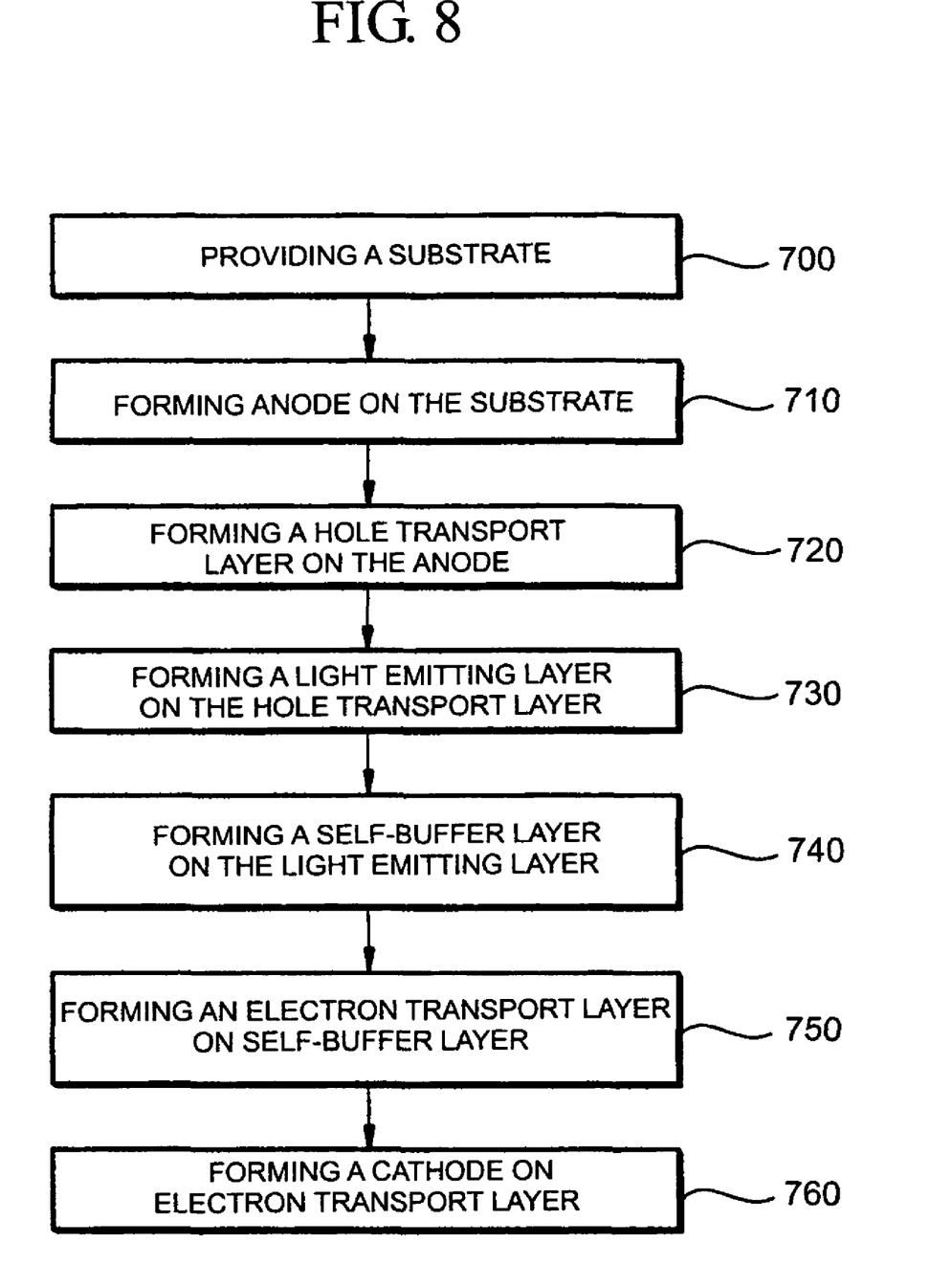
FIG. 8 is a flow chart of a method of manufacturing the OLED of FIG. 4.

Turning now to FIG. 8, FIG. 8 is a flow chart of a method of manufacturing the OLED of FIG. 4 according to an embodiment of the present invention. Here, the same reference numerals used in FIG. 2 are used again to denote the same elements and thus their descriptions will not be repeated.

Referring to FIG. 8, the method includes providing the substrate 210 (step 700), forming the anode 220 on a substrate 210 (step 710), forming the hole transport layer 230 on the anode 220 (step 720), forming the light emitting layer 250 on the hole transport layer 230 (step 730), forming the self-buffer layer 240' on the light emitting layer 250 to protect the light emitting layer 250 (step 740), forming the electron transport layer 410 on the self-buffer layer 240 using the same material as for forming the self-buffer layer 240' (step 750), and forming the cathode 260 on the electron transport layer 410 (step 760). The self-buffer layer 240' is preferably made of a conductive polymer.

The OLED of FIG. 4 is also manufactured by a wet process, such as a spin coating method. In the forming of the self-buffer layer 240' in step 740, a buffer layer solvent, such as a solvent of a xylene group or a toluene group, is used. Such solvents generate less defects in the light emitting layer 250, and have less solubility for the light emitting layer 250 than the solvent later used for forming the electron transport layer 410. After coating a buffer layer solution that includes a buffer layer solvent and a conductive polymer solute, which is a main component of the buffer layer 240', on the light emitting layer 250, the resultant product is baked. The result is a conductive polymer corresponding to the self-buffer layer 240' stacked on the light emitting layer 250. Next, in the forming of the electron transport layer 410 on the buffer layer 240' (step 750), a solvent having high solubility, such as a solvent of a chlorobenzene group, is generally used. The conductive polymer self-buffer layer 240' formed on the light emitting layer 250 serves to protect the light emitting layer 250 from being damaged by the chlorobenzene group solvent in the formation of the electron transport layer 410.

As described above, the lifespan of an OLED according to the present invention can be improved by reducing the number of defects on lower layers by including a self-buffer layer 240 prior to the formation of the light emitting layer 250. Also, the color purity of an OLED according to the present invention can be improved by including a self-buffer layer 240' between the light emitting layer 250 and the electron transport layer 410 while reducing the number of defects produced on the light emitting layer 250. As shown FIG. 5, by including the first and second self-buffer layers 240 and 240' between the hole transport layer 230 and light emitting layer 250, and the light emitting layer 250 and the electron transport layer 410, the life span and color purity of an OLED according to the present invention can be improved.

While the present invention has been particularly shown and described with reference to exemplary embodiments thereof, it will be understood by those of ordinary skill in the art that various changes in form and details can be made therein without departing from the spirit and scope of the present invention as defined by the following claims.

What is claimed is:

1. An organic light emitting device (OLED), comprising:
   an anode;
   a cathode;
   a hole transport layer arranged between the anode and the cathode;
   a self-buffer layer arranged between the hole transport layer and the cathode, the self-buffer layer being adapted to protect the hole transport layer, the self-buffer layer being comprised of a first material; and
   a light emitting layer arranged between the self-buffer layer and the cathode, the light emitting layer also being comprised of the first material, the first material being a conductive polymer.

2. The OLED of claim 1, the self-buffer layer being arranged adjacent to the light emitting layer.

3. The OLED of claim 1, the self-buffer layer being in direct contact with the light emitting layer.

4. The OLED of claim 1, the self-buffer layer being arranged between the hole transport layer and the light emitting layer.

5. The OLED of claim 1, the self-buffer layer being between 5 and 30 nm thick and the light emitting layer being between 50 and 100 nm thick.

6. The OLED of claim 1, produced by a process comprising:
   forming the hole transport layer on the anode;
   forming the self-buffer layer on the hole transport layer by dissolving material of the self-buffer layer in a first solvent;
   forming the light emitting layer on the self-buffer layer by dissolving material of the light-emitting layer in a second and different solvent; and
   forming the cathode on the light-emitting layer, the first solvent having a lower solubility of the hole transport layer than the second solvent.

7. The OLED of claim 6, the first solvent being selected from the group consisting of a xylene group solvent and a toluene group solvent, the second solvent being of a chlorobenzene group.

8. The OLED of claim 1, the light emitting layer being comprised of the same material as the self-buffer layer.

9. The OLED of claim 1, the light emitting layer and the self-buffer layer having identical compositions.

10. An organic light emitting device (OLED), comprising:
    an anode;
    a cathode;
    a hole transport layer arranged between the anode and the cathode;
    a light emitting layer arranged between the hole transport layer and the cathode;
    a self-buffer layer arranged between the light emitting layer and the cathode, the self-buffer layer being adapted to protect the light emitting layer, the self-buffer layer comprising a conductive polymer; and
    an electron transport layer arranged between the self-buffer layer and the cathode, the electron transport layer being comprised of the same material as the self-buffer layer.

11. The OLED of claim 10, the self-buffer layer being in direct contact with the light emitting layer and being arranged between the light emitting layer and the electron transport layer.

12. The OLED of claim 10, the electron transport layer and the self-buffer layer having identical compositions.

13. An organic light emitting device (OLED), comprising:
    an anode;
    a cathode;
    a hole transport layer arranged between the anode and the cathode;
    a first self-buffer layer arranged between the hole transport layer and the cathode, the first self-buffer layer being adapted to protect the hole transport layer, the first self-buffer layer being comprised of a first material;
    a light emitting layer arranged between the first self-buffer layer and the cathode, the light emitting layer also being comprised of the first material;
    a second self-buffer layer arranged between the light emitting layer and the cathode, the second self-buffer layer being adapted to protect the light emitting layer, the second self-buffer layer comprising a second material; and
    an electron transport layer arranged between the second self-buffer layer and the cathode, the electron transport layer comprising the second material, wherein the first and second material is a conductive polymer.

14. The OLED of claim 13, each of the first self-buffer layer and the second self-buffer layer being in direct contact with the light emitting layer.

15. The OLED of claim 13, the light emitting layer being comprised of the same material as the first self-buffer layer.

16. The OLED of claim 13, the electron transport layer being comprised of the same material as the second self-buffer layer.

17. The OLED of claim 13, the electron transport layer and the second self-buffer layer having identical compositions.

* * * * *